United States Patent
Ishii et al.

(10) Patent No.: US 8,551,889 B2
(45) Date of Patent: Oct. 8, 2013

(54) MANUFACTURE METHOD FOR PHOTOVOLTAIC MODULE

(75) Inventors: Yousuke Ishii, Otsu (JP); Shingo Okamoto, Toyonaka (JP)

(73) Assignee: Sanyo Electric Co., Ltd., Moriguchi-Shi, Osaka (JP)

( * ) Notice: Subject to any disclaimer, the term of this patent is extended or adjusted under 35 U.S.C. 154(b) by 0 days.

(21) Appl. No.: 13/455,957

(22) Filed: Apr. 25, 2012

(65) Prior Publication Data

US 2012/0214271 A1 Aug. 23, 2012

Related U.S. Application Data

(62) Division of application No. 12/728,863, filed on Mar. 22, 2010, now Pat. No. 8,187,982.

(30) Foreign Application Priority Data

Mar. 23, 2009 (JP) ................................ 2009-070469

(51) Int. Cl.
*H01L 21/302* (2006.01)
*H01L 21/461* (2006.01)

(52) U.S. Cl.
USPC .... 438/753; 436/509; 436/617; 257/E21.077; 257/E21.121; 257/E21.129; 257/E21.166; 257/E21.264; 257/E21.267; 257/E21.288

(58) Field of Classification Search
USPC ................... 438/753, 509, 617, 97, 311, 618, 438/602, 603, 604, 781; 257/E21.077, E21.121, 257/E21.129, E21.166, E21.264, E21.267, 257/E21.288
See application file for complete search history.

(56) References Cited

U.S. PATENT DOCUMENTS

| 6,245,987 | B1 | 6/2001 | Shiomi et al. |
| 8,187,982 | B2 * | 5/2012 | Ishii et al. ..................... 438/753 |
| 2008/0011350 | A1 | 1/2008 | Luch |
| 2009/0288697 | A1 | 11/2009 | Shimizu et al. |
| 2010/0181011 | A1 | 7/2010 | Hashimoto et al. |

FOREIGN PATENT DOCUMENTS

| JP | 59-074848 A | 4/1984 |
| JP | 2000-335816 A | 12/2000 |
| JP | 2004-078229 A | 3/2004 |
| WO | 2009/011209 A1 | 1/2009 |

OTHER PUBLICATIONS

Notification of Reason(s) for Refusal dated Mar. 26, 2013, issued in corresponding Japanese Patent Application No. 2009-070469.

* cited by examiner

*Primary Examiner* — David Nhu
(74) *Attorney, Agent, or Firm* — Ditthavong Mori & Steiner, P.C.

(57) ABSTRACT

In a manufacture method for a photovoltaic module, a plurality of strips of resin adhesive film having a desired width and unwound from a single feeding reel is simultaneously pasted on a solar cell. In particular, the manufacture method is implemented by performing the steps of: unwinding a resin adhesive film sheet from a reel on which the resin adhesive film sheet is wound; splitting the unwound resin adhesive film into two or more film strips in correspondence to lengths of wiring material to bond; pasting the strips of resin adhesive film on an electrode of the solar cell; and placing the individual lengths of wiring material on the electrode of the solar cell having the plural strips of resin adhesive film pasted thereon and thermally setting the resin adhesive film by heating so as to fix together the electrode of the solar cell and the wiring material.

12 Claims, 11 Drawing Sheets

MANUFACTURE METHOD FOR PHOTOVOLTAIC MODULE

This application is a divisional of U.S. patent application Ser. No. 12/728,863, filed Mar. 22, 2010, now U.S. Pat. No. 8,187,982, which claims priority to Japanese Patent Application No. 2009-70469, filed Mar. 23, 2009, the entireties of which are hereby incorporated by reference.

BACKGROUND OF THE INVENTION

1. Field of the Invention

The present invention relates to a manufacture method for photovoltaic module.

2. Description of the Prior Art

A photovoltaic module has a construction wherein a plurality of solar cells are connected in series and/or in parallel by means of wiring members electrically connected to electrodes on front and back sides thereof. In the manufacture of the photovoltaic module, the conventional practice is to use solder for connecting the electrodes of the solar cells with the wiring members. The solder is widely used because of its excellent connection reliability including conductivity, bonding strength and the like.

From an environmental standpoint and the like, on the other hand, the solar cells also employ a wiring connection method not relying on the solder. There is known a method, for example, which uses a conductive adhesive film to interconnect the solar cells and the wiring material. Such a method is disclosed in, for example, United States Patent Publication No. 2009/0288697A1.

To connect the wiring material using the conductive adhesive film, the conductive adhesive film first need be pasted on a collector electrode of the solar cell. The conductive adhesive film is normally wound on a reel. A conductive adhesive sheet is unwound from the reel and an unwound portion of the sheet is pressure bonded to the solar cell by means of a film pasting device. Thus, the conductive adhesive film is pasted on the collector electrodes of the solar cells.

FIG. 12 is schematic perspective view showing an arrangement of the film pasting device. As shown in FIG. 12, the device comprises a conductive adhesive film feeding reel 200 having a conductive adhesive film sheet 50 wound thereon, and a carrier film take-up reel 201. The conductive adhesive film sheet 50 unwound from the feeding reel 200 is advanced to the carrier film take-up reel 201 by means of guide rolls 202, 202 via a pasting stage to past the film sheet on a solar cell 1. A conductive adhesive film 5 is pasted on a predetermined portion of the solar cell 1.

Before reaching the pasting stage, the conductive adhesive film sheet 50 is half-cut by a cutter 203 such that only an adhesive layer thereof is cut to a length in which the film sheet is pasted on the solar cell 1.

At the pasting stage, the conductive adhesive film sheet is pressed against the solar cell 1 at a predetermined pressure. Subsequently, the conductive adhesive film 5 is peeled off a carrier sheet and pasted on the solar cell 1. The carrier sheet is advanced from the guide roll 202 to the carrier film take-up reel 201 so as to be wound thereon. An apparatus has been contemplated which employs such film pasting devices for pasting the films on plural places in the apparatus. Such a method is disclosed in, for example, JP2004-78229(A).

A single apparatus having a mechanism for pasting the conductive adhesive films on upper and lower sides of a substrate negates the need for turning over the substrate of the solar cell requiring the films to be pasted on the upper and lower sides thereof. This makes it possible to reduce tact time.

However, the above-described method has the following problems because it requires as many conductive adhesive film feeding reels as the pasting stages of the pasting devices.

Firstly, the increase of the pasting positions leads to the increase of the feeding reels and thence, cost increase. Furthermore, a problem exists that the number of pasting lines is limited by the number of feeding reels.

Another problem is that the choices of width of the conductive adhesive film depend upon vendor's performance and hence, the width of the conductive adhesive film cannot be decreased from a given width. That is, the conductive adhesive film having too small a width cannot be wound on the reel. As it now stands, the conductive adhesive film must have a width of about 1.0 mm or more to be wound on the reel.

By the way, it is desired to reduce the width of the wiring material because the wiring material bonded to a light-incident side of the solar cell blocks the incident light. In a case where a wiring material having a width of 0.5 mm is used, for example, the conventional practice is to bond the wiring material with a conductive adhesive film having a width of 1.0 mm. As thermally set, the conductive adhesive film becomes tinted so that the light is shielded by the tinted portion of the film. Even though the 0.5 mm-wide wiring material is used, the light is shielded by the 1.0 mm-wide conductive adhesive film, which makes it impossible to increase light use efficiency.

SUMMARY OF THE INVENTION

It is an object of the invention to provide a method which permits a plurality of strips of conductive adhesive film having a desired width and wound on a single feeding reel to be simultaneously pasted on the solar cell so as to reduce costs and unwanted light shielding.

In accordance with the invention, a manufacture method for photovoltaic module, in which a wiring material is electrically connected to an electrode of a solar cell by using a resin adhesive film, comprises the steps of: unwinding the resin adhesive film from a reel on which the resin adhesive film is wound; splitting the unwound resin adhesive film into two or more strips in correspondence to lengths of wiring material to bond; pasting the strips of resin adhesive film on the electrode of the solar cell; and placing the individual lengths of wiring material on the electrode of the solar cell having the two or more strips of resin adhesive film pasted thereon and thermally setting the resin adhesive film by heating so as to fix together the electrode of the solar cell and the wiring material.

The above arrangement permits the resin adhesive film fed by a single feeding reel to be split into plural strips of adhesive film and delivered simultaneously and hence, the apparatus cost can be reduced. Furthermore, the light shielding by the resin adhesive film can be eliminated by making the width of the conductive adhesive film equal to or slightly smaller than that of the wiring material.

In accordance with the invention, the manufacture method for photovoltaic module employs: a first reel on which a resin adhesive film corresponding to an electrode on a front side of the solar cell is wound; and a second reel on which a resin adhesive film corresponding to an electrode on a back side of the solar cell is wound, and further comprises the steps of: unwinding the resin adhesive films from the first and second reels, respectively; and splitting each of the unwound resin adhesive films into two or more strips in correspondence to the lengths of wiring material.

The above arrangement permits the resin adhesive films to be simultaneously pasted on the front and back sides of the solar cell without turning over the solar cell.

It is preferred to provide a length adjustment mechanism somewhere between a place of the splitting step and a place of the pasting step in order to ensure that all the strips of resin adhesive film move the same distance from a position of the reel to pasting positions on the solar cell.

All the strips of resin adhesive film are guided over the same distance whereby the resin adhesive film can get used up without being wasted.

An arrangement may be made such that the resin adhesive film comprises an adhesive layer overlaid on a base material and a take-up device for taking up the base material is disposed downstream of the pasting positions on the solar cell.

Figure 1:
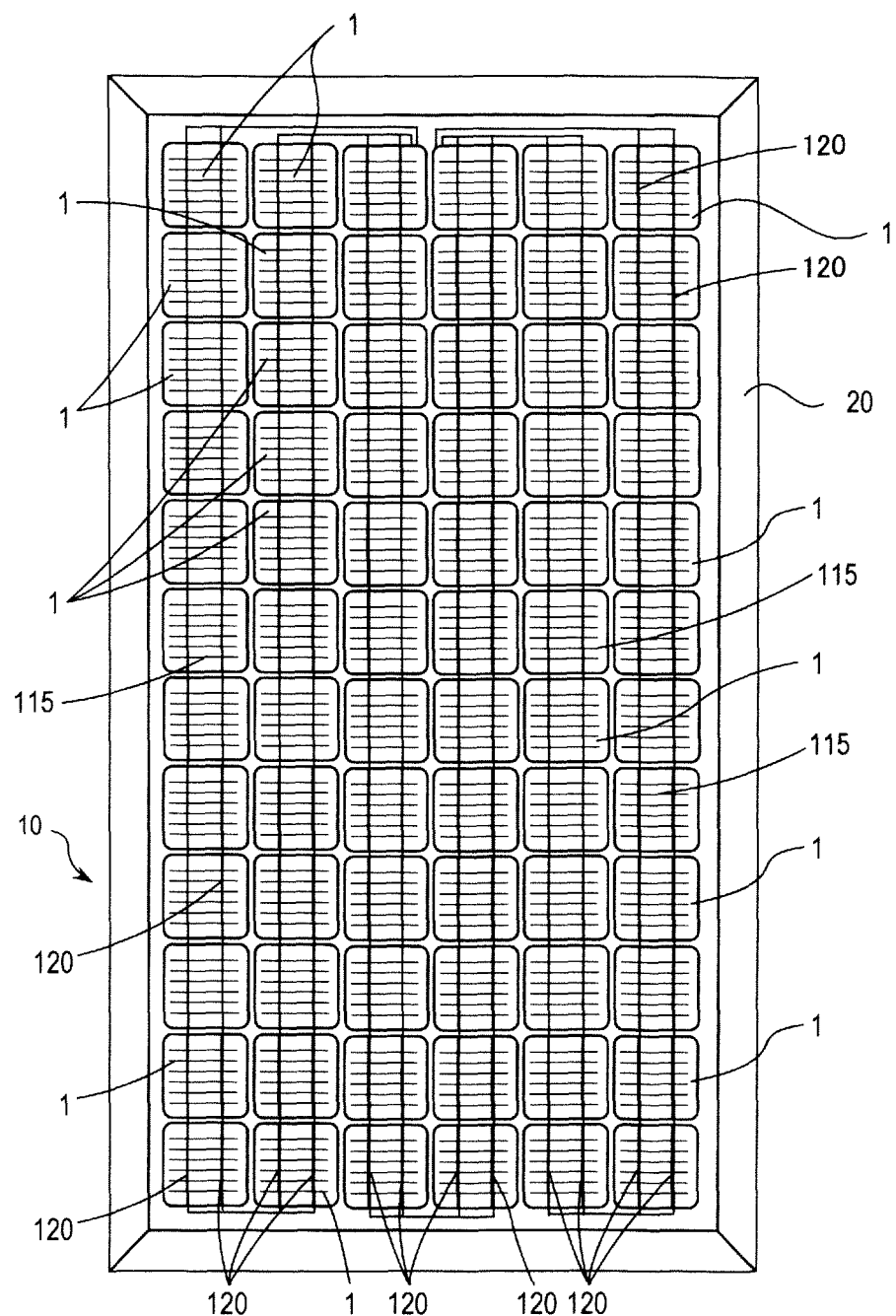
FIG. 1 is a schematic diagram showing a photovoltaic module wherein electrodes of solar cells and a wiring material are interconnected using a conductive adhesive film.

The foregoing and other objects, features, aspects and advantages of the present invention will become more apparent from the following detailed description of the present invention when reviewed in conjunction with the accompanying drawings.

DETAILED DESCRIPTION OF THE PREFERRED EMBODIMENTS

A preferred embodiment of the invention will be described in detail with reference to the accompanying drawings. In the drawings the same or similar reference numerals are used to refer to the same or similar components which are explained only once to avoid repetition.

Figure 2:
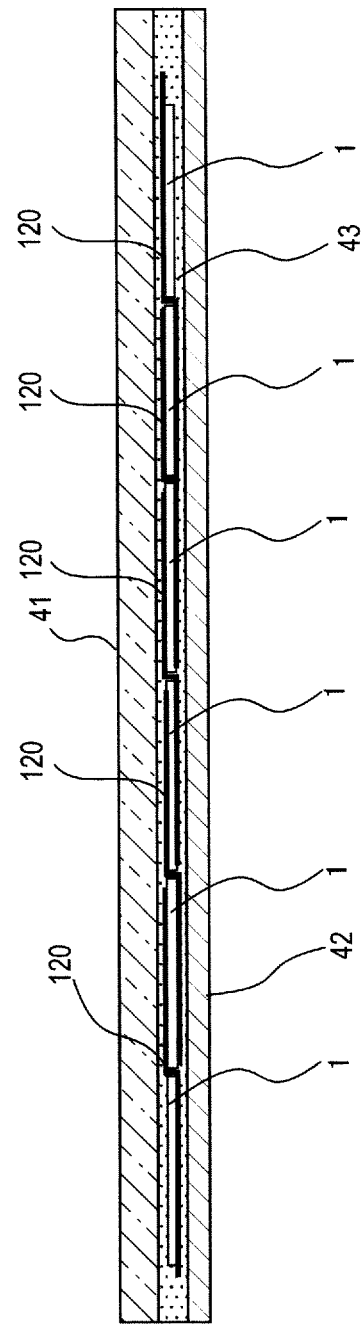
FIG. 2 is a sectional view schematically showing the photovoltaic module manufactured according to the invention.
Figure 3:
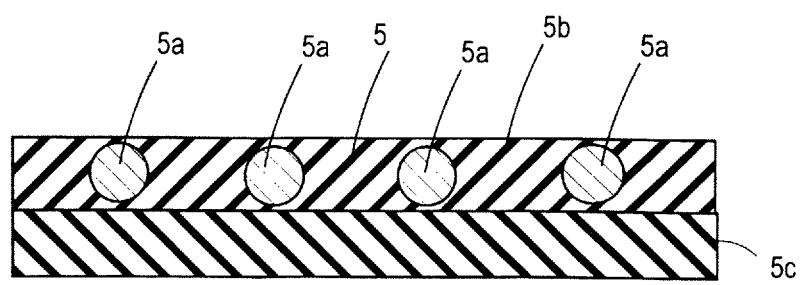
FIG. 3 is a schematic sectional view showing the conductive adhesive film employed by the invention.
Figure 4:
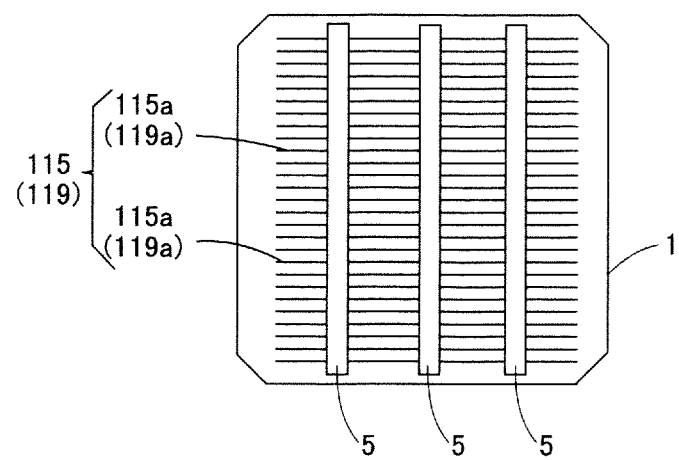
FIG. 4 is a plan view showing a solar cell having the conductive adhesive film pasted thereon according to the invention.
Figure 5:
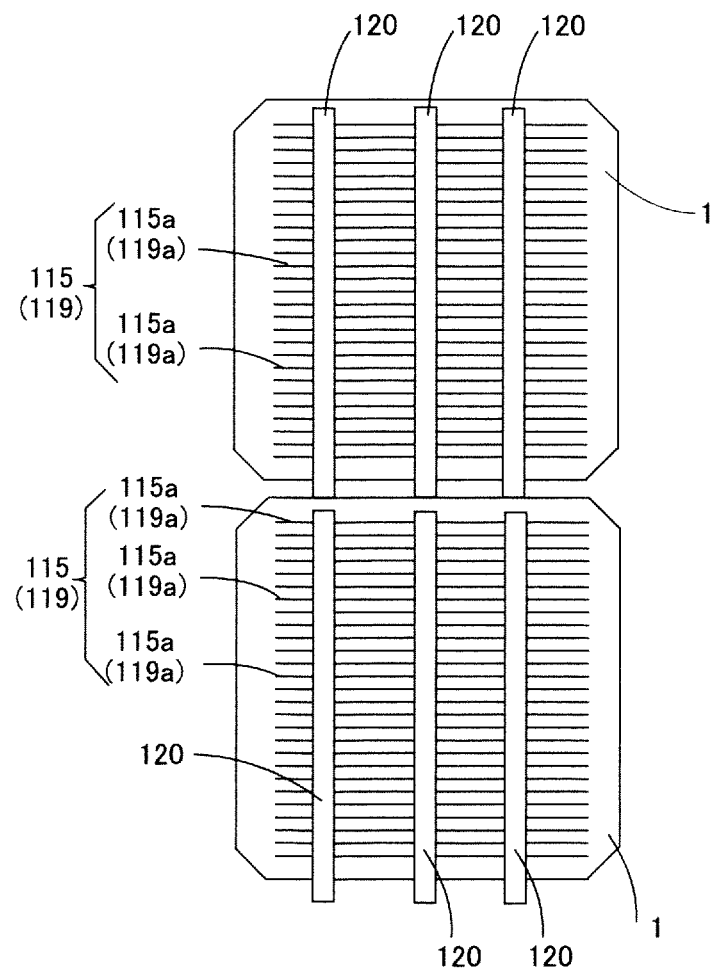
FIG. 5 is a plan view showing a principal part of the photovoltaic module manufactured according to the invention.
Figure 6:
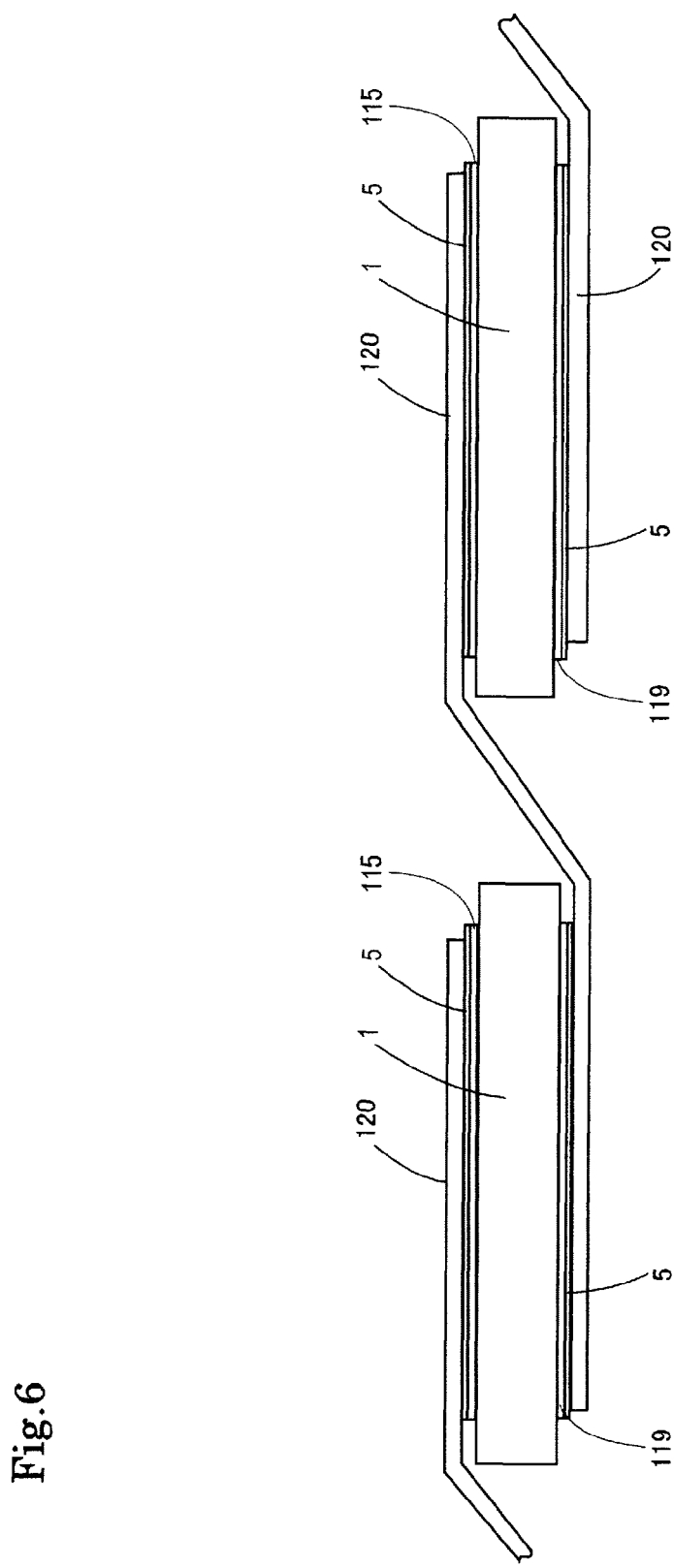
FIG. 6 is a schematic sectional view showing the principal part of the photovoltaic module manufactured according to the invention.

FIG. 1 is a plan view schematically showing a photovoltaic module manufactured according to the invention. FIG. 2 is a sectional view schematically showing the photovoltaic module fabricated according to the invention. FIG. 3 is a schematic sectional view showing a conductive adhesive film employed by the invention. FIG. 4 is a plan view showing a solar cell having the conductive adhesive film pasted thereon according to the invention. FIG. 5 is a plan view showing a principal part of the photovoltaic module manufactured according to the invention. FIG. 6 is a schematic sectional view showing the principal part of the photovoltaic module manufactured according to the invention.

The embodiment of the invention employs a conductive adhesive film, for example, as a resin adhesive film. As illustrated by the schematic sectional view of FIG. 3, a conductive adhesive film 5 comprises at least a resin adhesive component 5b and conductive particles 5a dispersed therein. The resin adhesive component 5b having the conductive particles 5a dispersed therein is overlaid on a base film 5c made of polyimide or the like. The resin adhesive component 5b comprises a composition containing a thermosetting resin. Examples of the usable thermosetting resins include epoxy resins, phenoxy resins, acrylic resins, polyimide resins, polyamide resins, polycarbonate resins and the like. These thermosetting resins may be used alone or in combination of two or more types. It is preferred to use one or more thermosetting resins selected from the group consisting of epoxy resins, phenoxy resins and acrylic resins.

Examples of usable conductive particles 5a include metal particles such as gold particles, silver particles, copper particles and nickel particles; and conductive particles, such as gold plated particles, copper plated particles and nickel plated particles, which comprise conductive or insulative core particles coated with a conductive layer such as a metal layer.

According to the embodiment, the conductive adhesive film 5 having a width of 1.7 mm is wound on a feeding reel 51.

First, a photovoltaic module 10 manufactured according to the invention will be described with reference to FIG. 1 and FIG. 2.

As shown in FIG. 1 and FIG. 2, the photovoltaic module 10 comprises a plurality of plate-like solar cells 1. This solar cell 1 comprises, for example, a crystalline semiconductor made of monocrystalline silicon or polycrystalline silicon having a thickness on the order of 0.15 mm and is generally shaped like a square 104 mm or 125 mm on a side. However, the invention is not limited to this and may employ any other solar cell.

An n-type region and a p-type region, for example, are formed in the solar cell 1 while an interfacial area between the n-type region and the p-type region defines a junction for forming an electric field for carrier separation. The n-region and p-region can be formed by using semiconductors for use in solar cell singly or in combination, the semiconductors including crystalline semiconductors such as monocrystalline silicon semiconductors and polycrystalline silicon semiconductors, compound semiconductors such as GaAs and InP, and thin film semiconductors such as thin films Si and CuInSe having an amorphous state or microcrystalline state. For example, the embodiment may employ a solar cell which includes an intrinsic amorphous silicon layer interposed between monocrystalline silicon and amorphous silicon layers having the opposite conductivities so as to reduce defects in interfaces therebetween and to achieve improved heterojunction interface characteristic.

As shown in FIG. 4 and FIG. 5, the solar cell 1 is formed with collector electrodes 115, 119 in predetermined regions of front and back sides thereof. The collector electrode 115, 119 is an electrode for collecting photogenerated carriers generated by a photoelectric conversion portion in the solar cell 1. The collector electrode 115, 119 includes, for example, a plurality of thin wire electrodes 115a, 119a formed in parallel arrangement. The thin wire electrode 115a, 119a has a width of about 100 μm, a pitch of about 2 mm and a thickness of about 60 μm. A set of about 50 thin wire electrodes is formed on a surface of the photoelectric conversion portion. Such thin wire electrodes 115a, 119a are formed, for example, by the steps of screen printing a silver paste and curing the silver paste at temperatures of a hundred and several tens degrees. The collector electrode 115, 119 may include a bus bar electrode.

A wiring material 120 is electrically connected to the collector electrode 115, 119. The conductive adhesive film 5 is used for connecting the wiring material 120 to the collector electrode 115, 119. The conductive adhesive film 5 is pressure bonded to place to which the wiring material 120 is bonded. The conductive adhesive film 5 to be pressure bonded has a width equal to or slightly smaller than that of the wiring material 120 to connect. If the wiring material 120 has a width of 0.5 mm to 3 mm, for example, the conductive adhesive film 5 also has a width of 0.5 mm to 3 mm in correspondence to the width of the wiring material 120. As shown in FIG. 5, this embodiment employs three lengths of 0.5 mm-wide wiring material 120. As shown in FIG. 4, therefore, three strips of conductive adhesive film 5 having a width corresponding to that of the wiring material 120 are pasted on each of the front and back sides of the solar cell 1 at places to which the lengths of wiring material 120 are bonded.

The wiring material 120 is pressed against the conductive adhesive film 5. The conductive adhesive film is heat treated under pressure for thermally setting an adhesive layer thereof so that the wiring material 120 is connected to the collector electrode 115, 119.

The above description is made by way of example where the collector electrode 119 on the back side comprises the thin wire electrodes 119a. In the case of a photovoltaic module arranged not to allow light incident on the back side, however, the module may also employ a solar cell having a metal electrode formed on the whole surface of the back side thereof.

As shown in FIG. 6, each of the plural solar cells 1 is electrically connected to its adjoining solar cell(s) by means of the wiring material 120 made of flat copper foil or the like. Specifically, one end of the wiring material 120 is connected to the collector electrode 115 on an upper side of a given solar cell 1 while the other end thereof is connected to the collector electrode 119 on a lower side of another solar cell 1 adjoining the given solar cell 1. These solar cells 1 are connected in series by means of the wiring material 120 so that the photovoltaic module 10 may provide a predetermined output of 200 W, for example, by way of a crossover wiring or lead-out wire.

As shown in FIG. 2, the plural solar cells 1 are electrically interconnected by means of the wiring material 120 made of the conductor such as copper foil. The solar cells are sealed between a translucent surface member 41 such as glass or translucent plastic and a backside member 42 with a translucent sealing material 43 such as EVA (ethylene vinyl acetate) having excellent weather resistance and moisture resistance. The backside member comprises a member such as weather-resistant film, glass or plastic.

The photovoltaic module 10 is fitted in outer frames 20 made of aluminum or the like by applying a seal material to outer peripheries thereof as needed. The outer frame 20 is formed of aluminum, stainless steel, roll forming steel sheet or the like. As needed, a terminal box (not shown) is attached to a surface of the backside member 42, for example.

In order to electrically connect the wiring material 120 made of the flat copper foil or the like to the above-described solar cells 1 by means of the conductive adhesive film 5, the conductive adhesive film 5 is first pasted on the collector electrodes 115, 119 on the front and back sides of the solar cells 1, respectively, as shown in FIG. 4.

The resin adhesive component of the conductive adhesive film 5 is a resin adhesive which primarily consists of an epoxy resin and contains a cross-linking promoter such that rapid cross-linking is promoted by heating at 180° C. to set the resin adhesive in 15 seconds or so. This conductive adhesive film 5 has a thickness of 0.01 to 0.05 mm. The width of the conductive adhesive film is preferably equal to or slightly smaller than that of the wiring material 120 in view of the fact that the film may shield the incident light. The embodiment employs a conductive adhesive film 5 in the form of a belt-like film sheet having a width of 0.5 mm and a thickness of 0.02 mm.

As described above, the conductive adhesive film 5 must have a width of 1 mm or more to be wound on the feeding reel. In conventional practice, a mechanism employing three feeding reels for feeding three strips of conductive adhesive film has been adopted. This results in complicated structure and cost increase.

Figure 7:
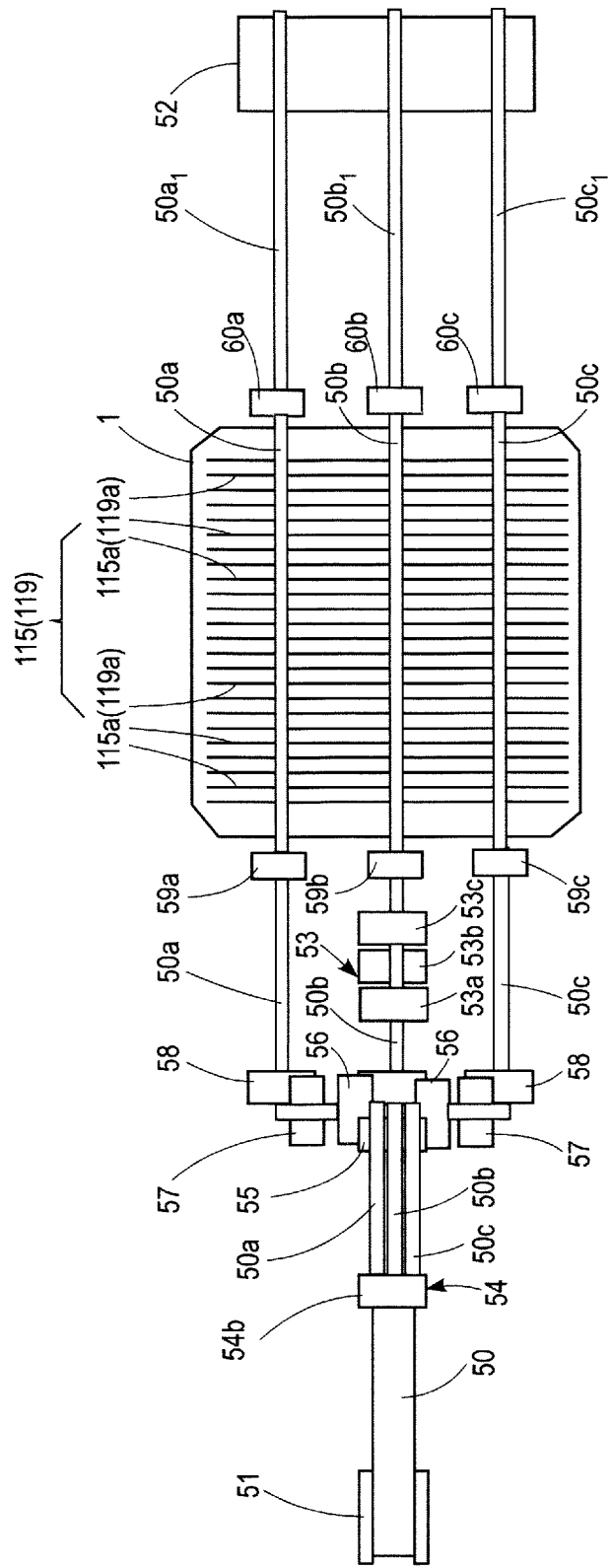
FIG. 7 is a plan view showing steps of feeding and pasting the conductive adhesive film according to a manufacture method of the invention.
Figure 8:
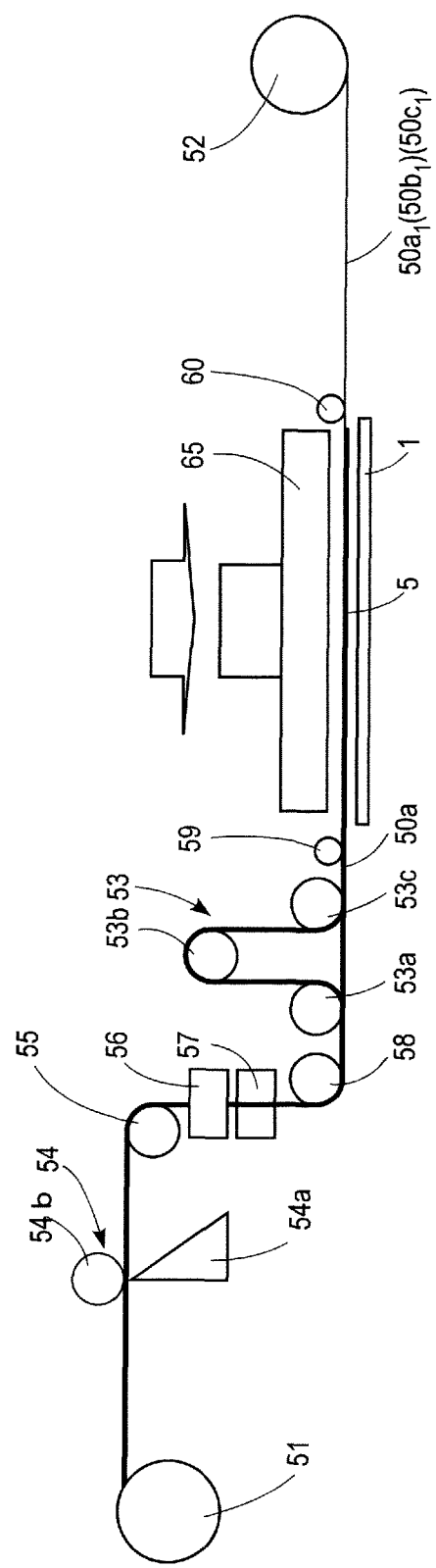
FIG. 8 is a side view showing the steps of feeding and pasting the conductive adhesive film according to the manufacture method of the invention.

Therefore, the embodiment has an arrangement which permits the conductive adhesive film 5 fed by a single feeding reel to be split into three film strips and delivered simultaneously. In this arrangement, the conductive adhesive film 5 to be delivered has a width equal to or smaller than that of the wiring material 120 such as to reduce light shielding by the conductive adhesive film 5. According to the embodiment, the feeding reel 51 having a 1.7 mm-wide conductive adhesive film sheet 50 wound thereon is prepared, as shown in FIG. 7 and FIG. 8. The conductive adhesive film sheet has a width more than the total width of three 0.5 mm-wide strips of conductive adhesive film 5 or a width of 1.6 mm to 2.0 mm, for example. The conductive adhesive film 50 unwound from the feeding reel 51 is split into the three 0.5 mm-wide strips of conductive adhesive film by means of a splitting cutter 54a and the strips of conductive adhesive film are pasted on the solar cell 1.

Referring to FIG. 7 and FIG. 8, the following description is made on a method comprising the steps of preparing the feeding reel 51 having the conductive adhesive film sheet 50 wound thereon, splitting the conductive adhesive film sheet 50 unwound from the feeding reel 51 into the three 0.5 mm-wide strips of conductive adhesive film, and pasting the strips of conductive adhesive film on the solar cell 1.

FIG. 7 is a plan view showing the steps of feeding and pasting the conductive adhesive film and FIG. 8 is a side view showing the above steps.

As shown in FIG. 7 and FIG. 8, the conductive adhesive film sheet 50 is wound on the feeding reel 51, the film having the width of 1.7 mm, for example, which is more than the total width of three 0.5 mm-wide strips of conductive adhesive film. The conductive adhesive film sheet 50 is unwound from this feeding reel 51. Disposed downstream of the feeding reel 51 is a splitting stage 54 which splits the conductive adhesive film sheet 50 into a required number of strips.

The splitting stage 54 includes the splitting cutter 54a for cutting the conductive adhesive film sheet 50 into strips of a predetermined width, and pressure roller 54b for pressing the conductive adhesive film sheet 50 against the splitting cutter 54*a*. The splitting cutter 54*a* splits the conductive adhesive film sheet 50 into three 0.5 mm-wide strips of conductive adhesive film 50*a*, 50*b*, 50*c*.

The three 0.5 mm-wide strips of conductive adhesive film 50*a*, 50*b*, 50*c* are guided to predetermined positions of the solar cell 1 by means of guide rollers 56, 57, 58. The conductive adhesive film strips 50*a*, 50*c* on the opposite sides are diverged to the lateral sides (upper and lower sides as seen in the figure) by the guide rollers 56, 57, 58 while the central conductive adhesive film strip 50*b* is directly advanced forward. The conductive adhesive film strips 50*a*, 50*c* move the same distance from the splitting stage 54 to pasting positions on the solar cell 1. However, the central conductive adhesive film strip 50*b* is directly advanced forward. In as-is condition, therefore, the film strip 50*b* moves a shorter distance than the other two conductive adhesive film strips 50*a*, 50*c* to travel from the splitting stage 54 to the pasting position on the solar cell 1. In this embodiment, therefore, a length adjustment mechanism 53 is provided somewhere between the splitting stage 54 and a place of pasting step in order to ensure that all the conductive adhesive film strips move the same distance to reach the pasting positions on the solar cell 1. The length adjustment mechanism 53 employs rollers 53*a*, 53*b*, 53*c* for bendingly guiding the conductive adhesive film strip 50*b* so as to increase traveling distance to the place of pasting step. In this manner, all the conductive adhesive film strips 50*a*, 50*b*, 50*c* are guided over the same distance whereby the resin adhesive film can get used up without being wasted.

At the place of pasting step, the conductive adhesive film strips 50*a*, 50*b*, 50*c* are guided to predetermined positions on the solar cell 1 by means of rollers 59*a*, 59*b*, 59*c*, 60*a*, 60*b*, 60*c*, respectively. Somewhere on the route to the roller 59*a*, 59*b*, 59*c*, the illustration of which is omitted, the conductive adhesive film sheet 50 is half-cut so that only the adhesive layer thereof is cut to a length in which the conductive adhesive film sheet is pasted on the solar cell 1.

The conductive adhesive film strips 50*a*, 50*b*, 50*c* held between respective pairs of rollers 59*a*, 59*b*, 59*c*, 60*a*, 60*b*, 60*c* are pressed against the collector electrode 115 (119) on the solar cell 1 by means of a pressing member 65. Respective adhesive-layer portions of the conductive adhesive film strips 50*a*, 50*b*, 50*c* are separated from base film strips and pasted on the solar cell 1. The base film strips 50*a*1, 50*b*1, 50*c*1 removed of the adhesive-layer portions are rewound on a take-up reel 52.

The embodiment has the arrangement which permits the conductive adhesive film fed by the single feeding reel to be split into three film strips and delivered simultaneously. The conductive adhesive film strip has the width as small as that of the wiring material 120 or so small as not to be wound on the reel. The three conductive adhesive film strips having such a width can be fed simultaneously.

Figure 9:
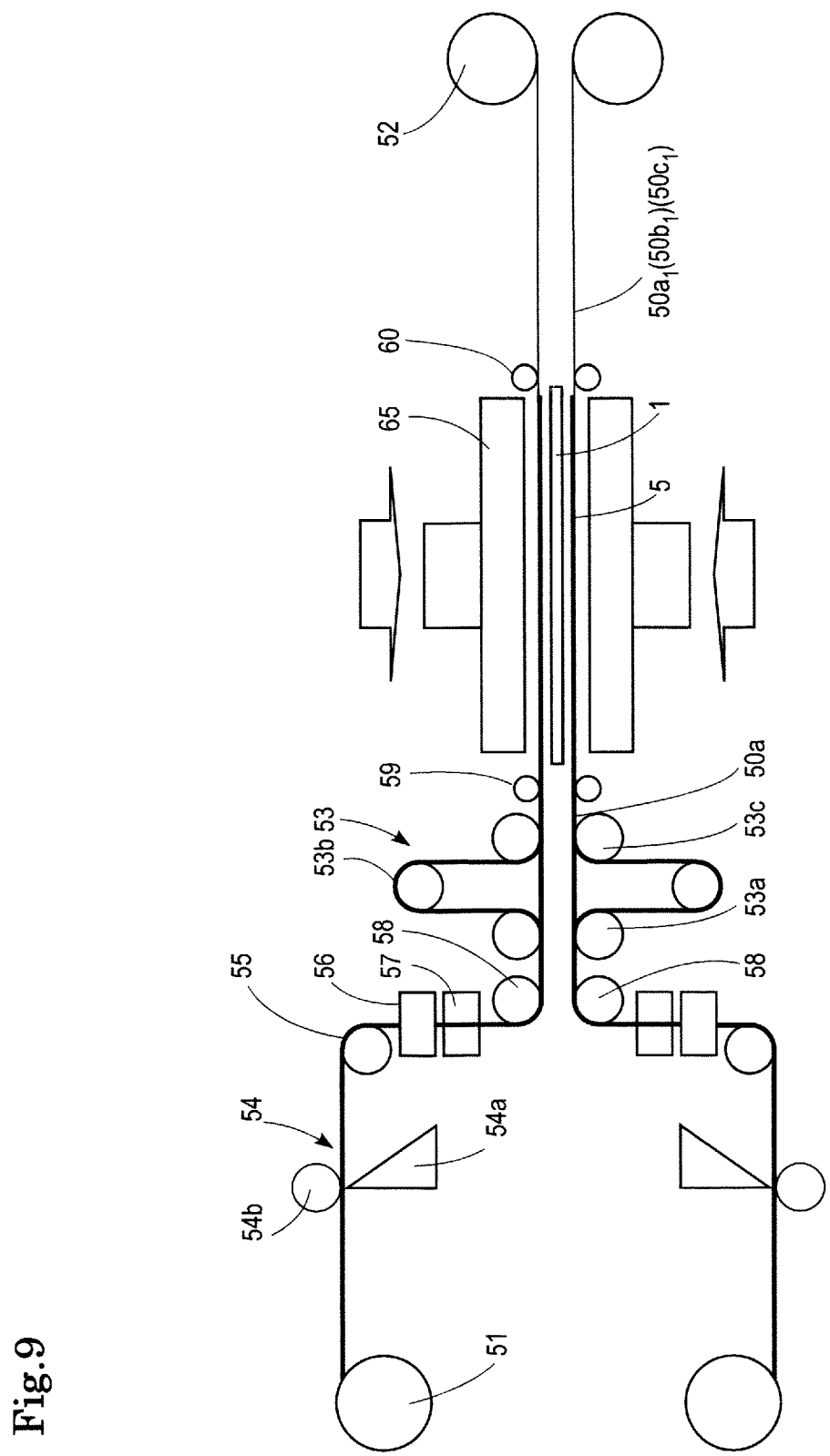
FIG. 9 is a side view showing the steps of feeding and pasting the conductive adhesive film according to the manufacture method of the invention.

As shown in FIG. 9, such a feeding mechanism is disposed on each of the front and back sides of the solar cell 1 such that respective sets of three conductive adhesive film strips can be simultaneously pasted on the front and back sides of the solar cell 1 without turning over the solar cell 1.

Next, description is made on a method of bonding the wiring material 120 to the solar cell 1 having the conductive adhesive film 5 pasted thereon.

Figure 10:
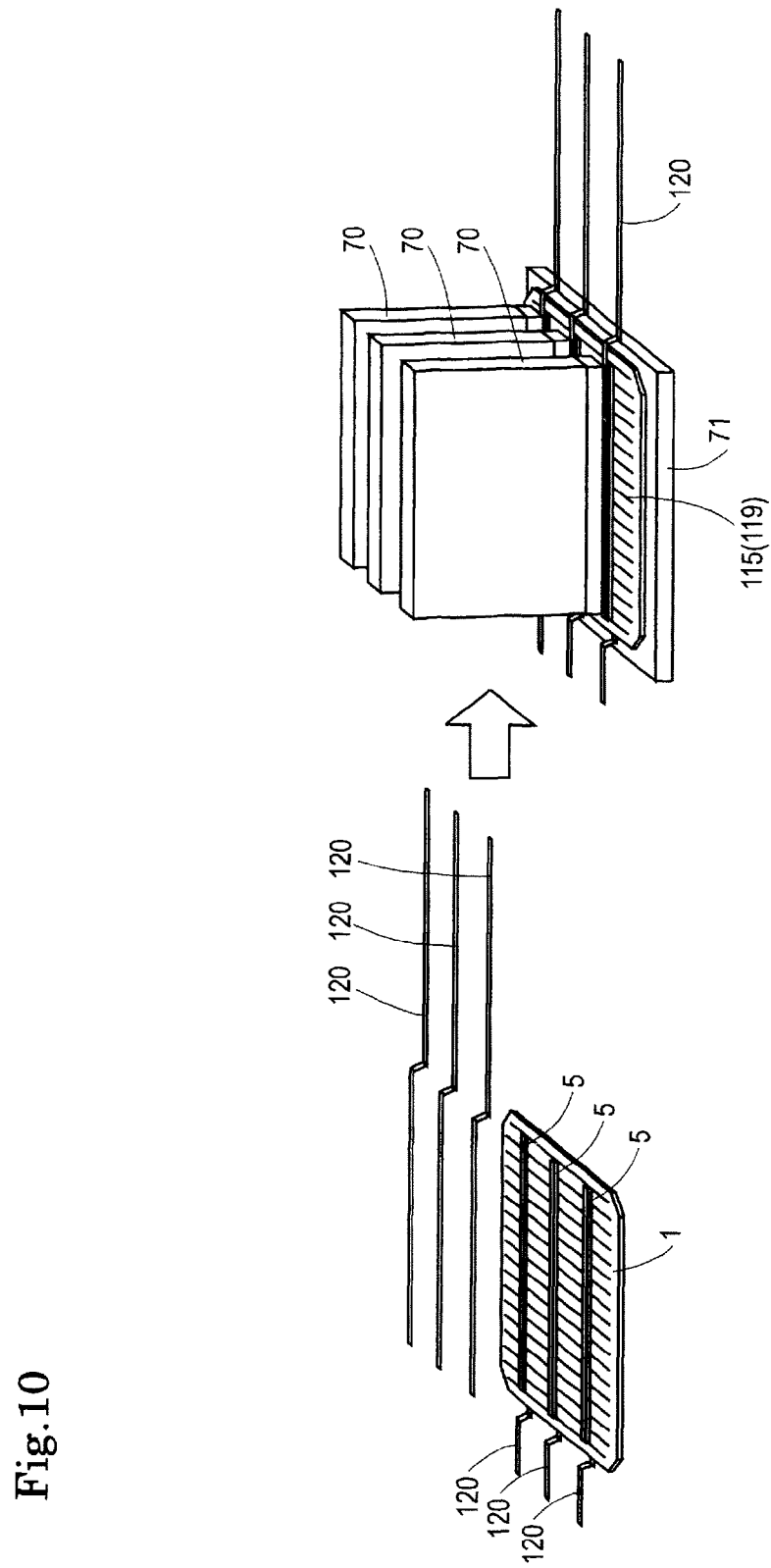
FIG. 10 is a schematic diagram showing individual steps of the manufacture method for photovoltaic module of the invention wherein the electrodes of the solar cells and the wiring material are interconnected using the conductive adhesive film.

As shown in FIG. 10, each of the plural solar cells 1 is electrically connected to its adjoining solar cell 1 by means of the wiring material 120. Specifically, the wiring material 120 is placed on each strip of conductive adhesive film 5 pasted on the front and back sides of the solar cell 1 such that one end of the wiring material 120 is connected to the collector electrode 115 on the upper side of a given solar cell 1 while the other end thereof is connected to the collector electrode 119 on the lower side of another solar cell 1 adjoining the given solar cell 1. The wiring material 120 is temporarily fixed to place by temporarily pressure bonding the wiring material under low temperature, low pressure conditions. The step of temporarily fixing the wiring material is performed as follows. A heater block 70 is pressed down on the solar cell 1 placed on a hot plate 71 at a low pressure of about 0.2 MPa, for example, so as to press each wiring material 120 against the solar cell 1. The heater block 70 and hot plate 71 are operated at temperatures of about 90° C., for example, so as to provide low-temperature heating for about 1 second such that the resin adhesive component is not thermally set while the wiring material 120 is temporarily pressure bonded and fixed to place. The solar cells 1 with the wiring materials 120 temporarily fixed thereto are set in array so as to form a string.

In the case where the conductive resin film 5 containing the conductive particles 5*a* is used, the heater block 70 is used to pressure bond the wiring material 120 to the collector electrode 115 (119) in a manner such that the conductive particles 5*a* make contact with both the surface of the collector electrode 115 (119) and the surface of the wiring material 120 thereby establishing electrical connection between the collector electrode 115 (119) and the wiring material 120.

The pressure bonding and heating may be accomplished by an optimum method properly selected from a method wherein a metal block incorporating a heater is pressed against the wiring material to apply the predetermined pressure and heat and a method wherein a pressing member such as pressure pin and hot air are used to apply the predetermined pressure and heat.

Figure 11:
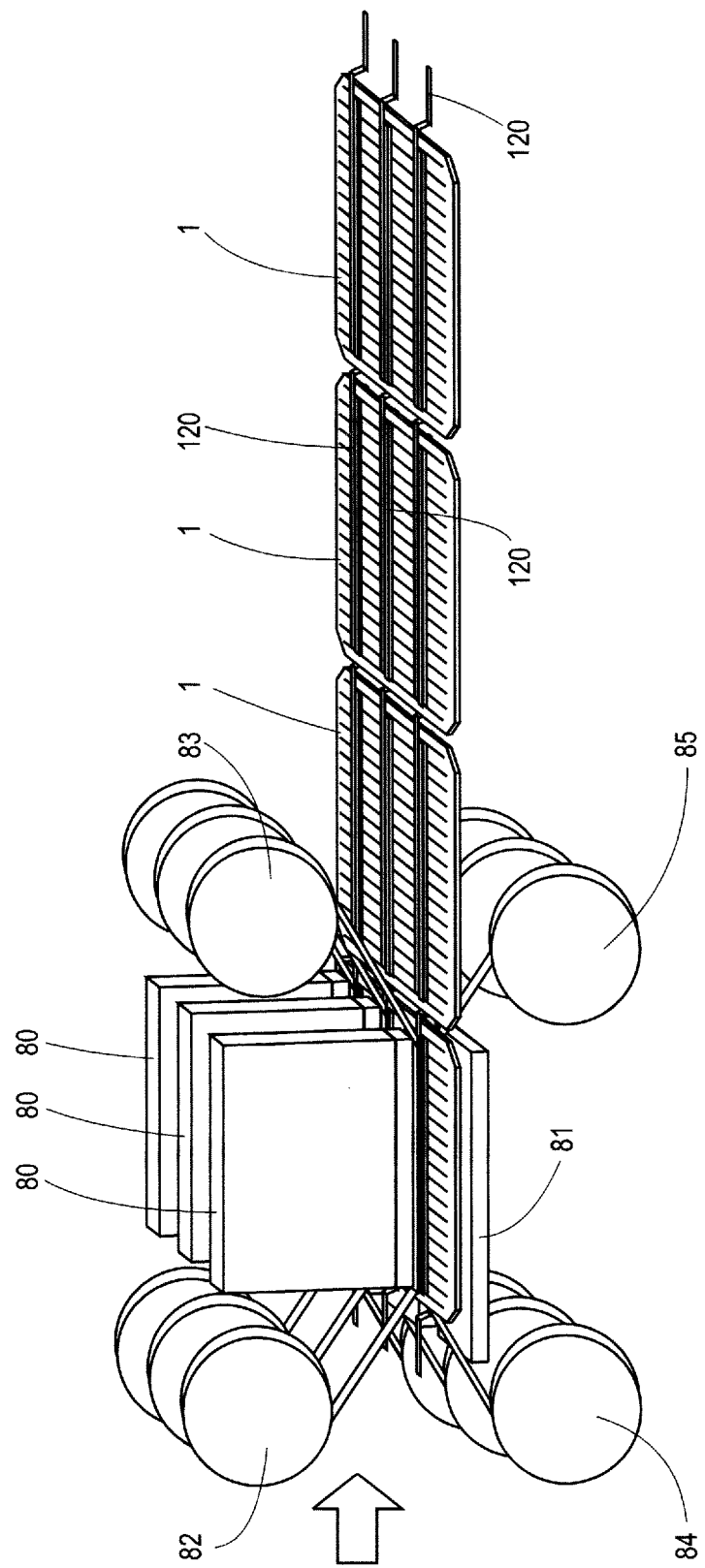
FIG. 11 is a schematic diagram showing the steps of the manufacture method for photovoltaic module of the invention wherein the electrodes of the solar cells and the wiring material are interconnected using the conductive adhesive film.
Figure 12:
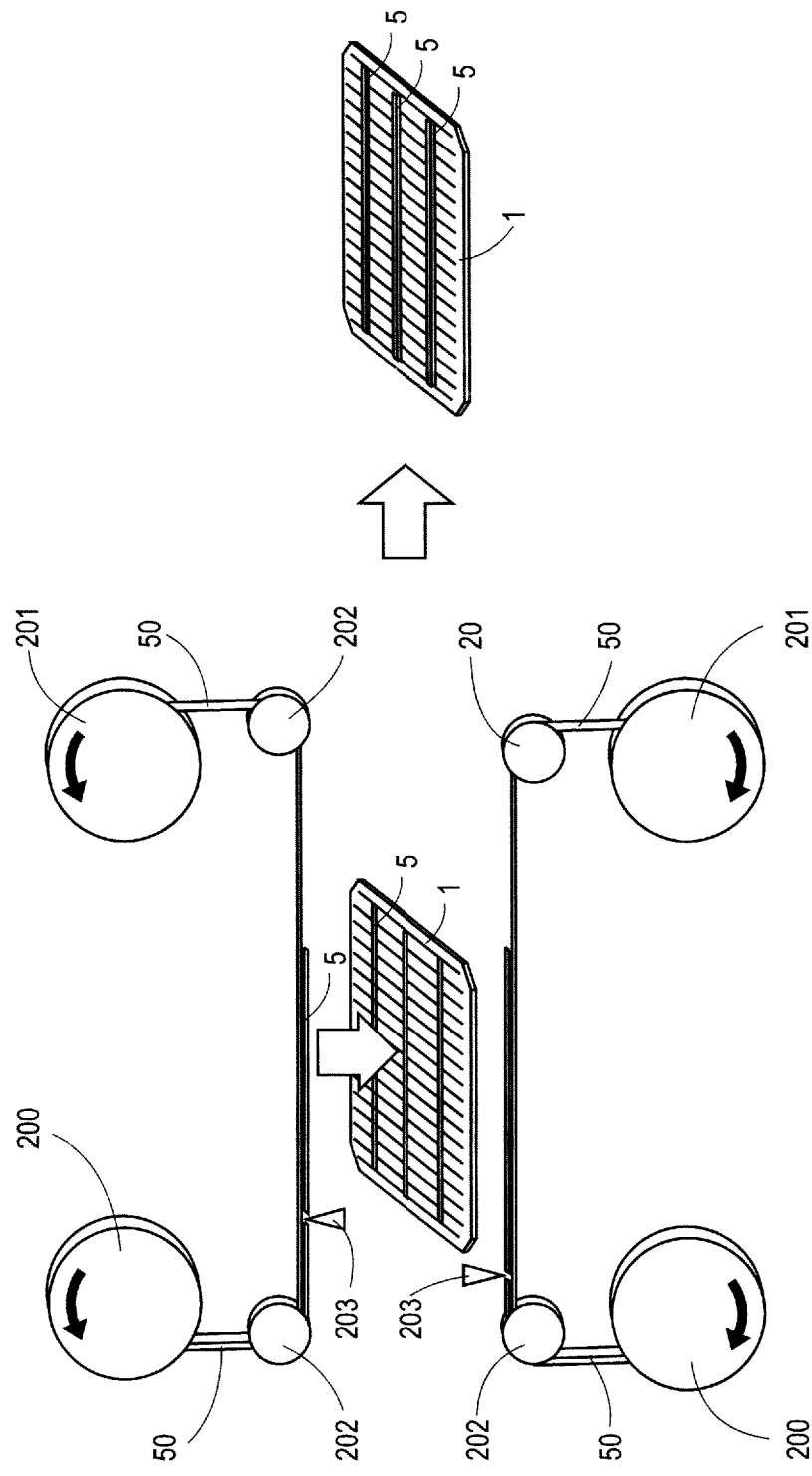
FIG. 12 is a schematic perspective view showing an arrangement of a conventional film pasting device.

Subsequently, as shown in FIG. 11, the wiring material 120 is permanently pressure bonded and fixed to place. In this step, a heater block 80 is pressed down on the solar cell 1 placed on a hot plate 81 at a high pressure of about 3 MPa, for example, so as to press the wiring material 120 against the solar cell 1, as shown in FIG. 11. The temperature of the heater block 80 and hot plate 81 is raised to, for example, 120° C. or above and 200° C. or below, such that high-temperature heating for thermally setting the resin adhesive component is provided thereby permanently pressure bonding and fixing the wiring material 120 to the solar cell 1. The solar cells 1 are electrically interconnected and set in array by fixing the wiring materials 120 thereto.

The heating temperature is set to 200° C. for example from the viewpoint of throughput and the like and the resin adhesive component is thermally set by 10-second heating thereby electrically and mechanically connecting the collector electrode of the solar cell with the wiring material.

The pressure bonding and heating under high temperature, high pressure conditions may be accomplished by an optimum method properly selected from the method wherein the metal block incorporating the heater is pressed against the wiring material to apply the predetermined pressure and heat and the method wherein the pressing member such as pressure pin and hot air are used to apply the predetermined pressure and heat.

While the above embodiment uses the conductive resin film as the resin film, a resin film free from the conductive particles may also be used. In a case where a resin adhesive free from the conductive particles is used, the electrical connection is established by partially placing the surface of the collector electrode 115 (119) in direct contact with a surface of a wiring material 120. It is preferred in this case that the wiring material 120 comprises a soft conductive film of tin (Sn), solder or the like formed on the surface of the conductor such as copper foil and the conductive film is softer than the collector electrode 115 (119) so as to allow the collector electrode 115 (119) to be partially embedded in and connected to the conductive film.

The string of plural solar cells 1 interconnected by means of the wiring material 120 is sandwiched between the translucent sealing material 43 such as EVA and laminated between the surface member 41 made of glass and the backside member 42 made of the translucent member such as weather-resistant film, glass or translucent plastic. Next, a laminator is used to seal the solar cells 1 between the surface member 41 and the backside member 42 with the sealing sheets 43. Subsequently, the laminate is placed in a furnace and allowed to cure through cross-linking reaction at about 150° C. for 10 minutes whereby adhesiveness between the sealing material 43 and the surface member 41 and between the sealing material 43 and the backside member 42 is increased. Thus is fabricated the photovoltaic module shown in FIG. 1 and FIG. 2.

While the above embodiment is described by way of the example where the solar cells 1 are interconnected by applying three wiring members 120 onto the respective solar cells 1, the number of wiring members 120 is not limited to three. The invention is applicable to any case where two or more lengths of wiring material 120 are used on the solar cell.

It should be understood that the embodiments disclosed herein are to be taken as examples in every point and are not limited. The scope of the present invention is defined not by the above described embodiments but by the appended claims. All changes that fall within means and bounds of the claims or equivalence of such means and bounds are intended to be embraced by the claims.

The invention claimed is:

1. A manufacture method for strings of photovoltaic module, wherein the strings include:
   plural solar cells having electrodes;
   a wiring material connected to one electrode and the other electrode of two adjoining solar cells of the plural solar cells; and
   an adhesive layer bonding the electrodes with the wiring material, the method comprising:
   pasting the adhesive layer on the electrodes;
   placing the wiring material on the adhesive layer after pasting; and
   heating and pressure bonding the wiring material thereon.

2. The manufacture method for strings of photovoltaic module according to claim 1, wherein the pasting step is to simultaneously pressure bond the adhesive layer on the electrodes on the front and back sides of the plural solar cells.

3. The manufacture method for strings of photovoltaic module according to claim 1, wherein the adhesive layer is formed on a base material, the method further comprising:
   cutting the adhesive layer formed on the base material to a length in which the adhesive layer is pasted on the plural solar cells before pasting the adhesive layer on the electrodes.

4. The manufacture method for strings of photovoltaic module according to claim 3, comprising:
   rewinding the base material removed of the adhesive layer after pasting the adhesive layer on the electrodes.

5. The manufacture method for strings of photovoltaic module according to claim 1, wherein the pressure bonding step employs:
   a temporarily pressure bonding step in which the wiring material is placed on the adhesive layer on the electrodes, heated at a first temperature and pressure bonded; and
   a permanently pressure bonding step in which the wiring material is heated at a second temperature at which an adhesive component in the adhesive layer is thermally set and pressure bonded after the temporarily pressure bonding step, and
   the first temperature is lower than the second temperature.

6. The manufacture method for strings of photovoltaic module according to claim 5, wherein pressure in the temporarily pressure bonding step is lower than that in the permanently pressure bonding step.

7. A manufacture apparatus for strings of photovoltaic module, wherein the strings include:
   plural solar cells having electrodes;
   a wiring material connected to one electrode and the other electrode of two adjoining solar cells of the plural solar cells; and
   an adhesive layer bonding the electrodes with the wiring material, the apparatus configured to:
   perform pasting the adhesive layer on the electrodes;
   perform placing the wiring material on the adhesive layer after pasting; and
   perform heating and pressure bonding the wiring material thereon.

8. The manufacture apparatus for strings of photovoltaic module according to claim 7, wherein the pasting step is to simultaneously pressure bond the adhesive layer on the electrodes on the front and back sides of plural solar cells.

9. The manufacture apparatus for strings of photovoltaic module according to claim 7, wherein the adhesive layer is formed on a base material, the apparatus further configured to:
   perform cutting the adhesive layer formed on the base material to a length in which the adhesive layer is pasted on plural solar cells before pasting the adhesive layer on the electrodes.

10. The manufacture apparatus for strings of photovoltaic module according to claim 9, comprising:
    a take-up reel rewinding the base material removed of the adhesive layer after pasting the adhesive layer on the electrodes.

11. The manufacture apparatus for strings of photovoltaic module according to claim 7, wherein the pressure bonding step employs:
    a temporarily pressure bonding step in which the wiring material is placed on the adhesive layer on the electrodes, heated at a first temperature and pressure bonded; and
    a permanently pressure bonding step in which the wiring material is heated at a second temperature at which an adhesive component in the adhesive layer is thermally set and pressure bonded after the temporarily pressure bonding step, and the first temperature is lower than the second temperature.

12. The manufacture apparatus for strings of photovoltaic module according to claim 11, wherein pressure in the temporarily pressure bonding step is lower than that in the permanently pressure bonding step.

* * * * *